United States Patent
Schlager et al.

(10) Patent No.: US 6,307,771 B1
(45) Date of Patent: Oct. 23, 2001

(54) INTEGRATED MEMORY HAVING 2-TRANSISTOR/2-CAPACITOR MEMORY CELLS

(75) Inventors: Tobias Schlager, Kumberg (AT); Heinz Hönigschmid, Starnberg (DE)

(73) Assignee: Siemens Aktiengesellschaft (DE)

( * ) Notice: Subject to any disclaimer, the term of this patent is extended or adjusted under 35 U.S.C. 154(b) by 17 days.

(21) Appl. No.: 09/584,329

(22) Filed: May 30, 2000

(30) Foreign Application Priority Data

May 28, 1999 (DE) .............................................. 199 24 567

(51) Int. Cl.[7] .................................................... G11C 11/12
(52) U.S. Cl. .............................. 365/145; 365/149; 365/63
(58) Field of Search .................................... 365/145, 149, 365/51, 63

(56) References Cited

U.S. PATENT DOCUMENTS 5,592,410  1/1997  Verhaeghe et al. ................... 365/145
5,764,561 * 6/1998  Nishimura ............................ 365/145

FOREIGN PATENT DOCUMENTS 690 31 847    5/1998  (DE) .

* cited by examiner

Primary Examiner—Vu A. Le

(57) ABSTRACT

An integrated memory includes word lines and bit lines intersecting each other at crossover points. The bit lines are combined into bit line pairs and the bit line pairs are interleaved by having at least one of the bit lines of one bit line pair disposed between the two bit lines of another bit line pair. 2-transistor/2-capacitor memory cells each have two 1-transistor/1-capacitor memory cells each disposed at a respective one of the crossover points. Each of the two 1-transistor/1-capacitor memory cells of the 2-transistor/2capacitor memory cells have a selection transistor connected to one of the two bit lines of a respective one of the bit line pairs and to at least one of the word lines. The selection transistors may be simultaneously activated for simultaneously accessing the two 1-transistor/1-capacitor memory cells of one of the 2-transistor/2-capacitor memory cell.

4 Claims, 3 Drawing Sheets

INTEGRATED MEMORY HAVING 2-TRANSISTOR/2-CAPACITOR MEMORY CELLS

BACKGROUND OF THE INVENTION

FIELD OF THE INVENTION

The invention relates to an integrated memory having 2-transistor/2-capacitor memory cells.

U.S. Pat. No. 5,592,410 discloses an integrated memory of the FRAM (Ferroelectric Random Access Memory) type, which has memory cells of the 2-transistor/2-capacitor type. In that case, each memory cell is formed by two 1-transistor/1-capacitor memory cells disposed at crossover points of word lines and bit lines. In that memory, the 1-transistor/1-capacitor memory cells are disposed at each crossover point between the bit lines and the word lines. The two 1-transistor/1-capacitor memory cells of each 2-transistor/2-capacitor memory cell are connected to two bit lines of a bit line pair in each case. The two bit lines of each bit line pair are disposed adjacent one another.

The memory disclosed in U.S. Pat. No. 5,592,410 has the disadvantage that, given a prescribed dimensioning of the bit lines, of the word lines and also of the spacings between the bit lines and the word lines for the realization of the memory cells (that is to say for their selection transistors and storage capacitors), there is only a certain area available. That is because the structure of the memory cells has to be adapted to the structure prescribed by the word lines and bit lines.

SUMMARY OF THE INVENTION

It is accordingly an object of the invention to provide an integrated memory having 2-transistor/2-capacitor memory cells, which overcomes the hereinafore-mentioned disadvantages of the heretofore-known devices of this general type and in which, given a prescribed dimensioning of bit lines and word lines, there is more space available for a realization of the memory cells than in the case of the prior art described.

With the foregoing and other objects in view there is provided, in accordance with the invention, an integrated memory, comprising word lines and bit lines intersecting each other at crossover points, the bit lines combined into bit line pairs, the bit line pairs interleaved by having at least one of the bit lines of one bit line pair disposed between the two bit lines of another bit line pair; 2-transistor/2-capacitor memory cells each having two 1-transistor/1-capacitor memory cells each disposed at a respective one of the crossover points; each of the two 1-transistor/1-capacitor memory cells of the 2-transistor/2-capacitor memory cells having a selection transistor connected to one of the two bit lines of a respective one of the bit line pairs and connected to at least one of the word lines; and a measure enabling the selection transistors to be simultaneously activated for simultaneously accessing the two 1-transistor/1-capacitor memory cells of one of the 2-transistor/2-capacitor memory cell.

This means that, in contrast to the prior art, the two bit lines of each bit line pair are not disposed adjacent one another, but rather are separated from one another by other bit lines. In other words, at least one bit line of another bit line pair is located between the two bit lines of each bit line pair.

The advantage of the invention is that a 1-transistor/1-capacitor memory cell does not have to be disposed at each crossover point between the word lines and bit lines in order to realize the 2-transistor/2-capacitor memory cells. therefore, given a prescribed dimensioning of the bit lines and word lines and the mutual spacing thereof, more space is available in the case of the memory according to the invention than if, as in the case of the prior art, the two 1-transistor/1-capacitor memory cells of each 2-transistor/2-capacitor memory cell were connected to bit lines disposed directly adjacent one another.

The two 1-transistor/1-capacitor memory cells of each 2-transistor/2-capacitor memory cell may, for example, be connected to two different word lines which are activated simultaneously in the event of an access. It is expedient, however, in accordance with another feature of the invention, if they are connected to a common word line, with the result that only the latter has to be activated in the event of the memory cell being accessed.

In accordance with a further feature of the invention, there are provided sense amplifiers which are each assigned to one of the bit line pairs and which have inputs that are connected to the associated bit lines in such a way that the corresponding connecting lines are crossed. The crossing of the connecting lines makes it possible for precisely one sense amplifier to be assigned to each bit line pair.

In accordance with a concomitant feature of the invention, each sense amplifier is assigned, in each case, to at least two of the bit line pairs and its inputs are connected to the associated bit lines of the two bit line pairs through a corresponding multiplexer in each case. The multiplexer makes it possible to avoid the transpositions or crossings of the connecting lines of the previously outlined embodiment of the invention. Moreover, the number of sense amplifiers required is smaller.

Other features which are considered as characteristic for the invention are set forth in the appended claims.

Although the invention is illustrated and described herein as embodied in an integrated memory having 2-transistor/2-capacitor memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
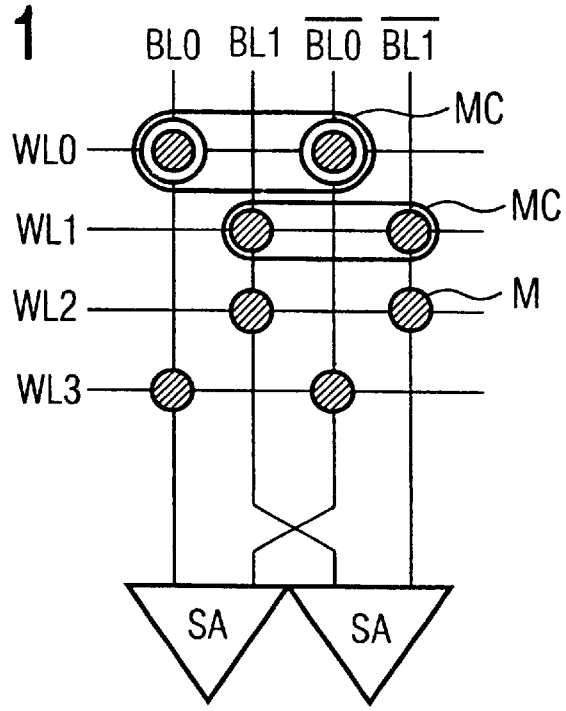
FIG. 1 is a schematic circuit diagram of a memory according to the invention, in which bit line pairs of the memory are connected to corresponding sense amplifiers by transposed connecting lines.

Referring now to the figures of the drawings in detail and first, particularly, to FIG. 1 thereof, there is seen a first exemplary embodiment of an integrated memory according to the invention. The memory has 1-transistor/1-capacitor memory cells M at crossover points of word lines WLi and bit lines BLi, $\overline{BLi}$, wherein i=0, 1, 2, 3, etc. However, the memory cells are not disposed at each crossover point. Rather, the 1-transistor/1-capacitor memory cells M are disposed only at every second bit line in the direction of the word lines.

Figure 5:
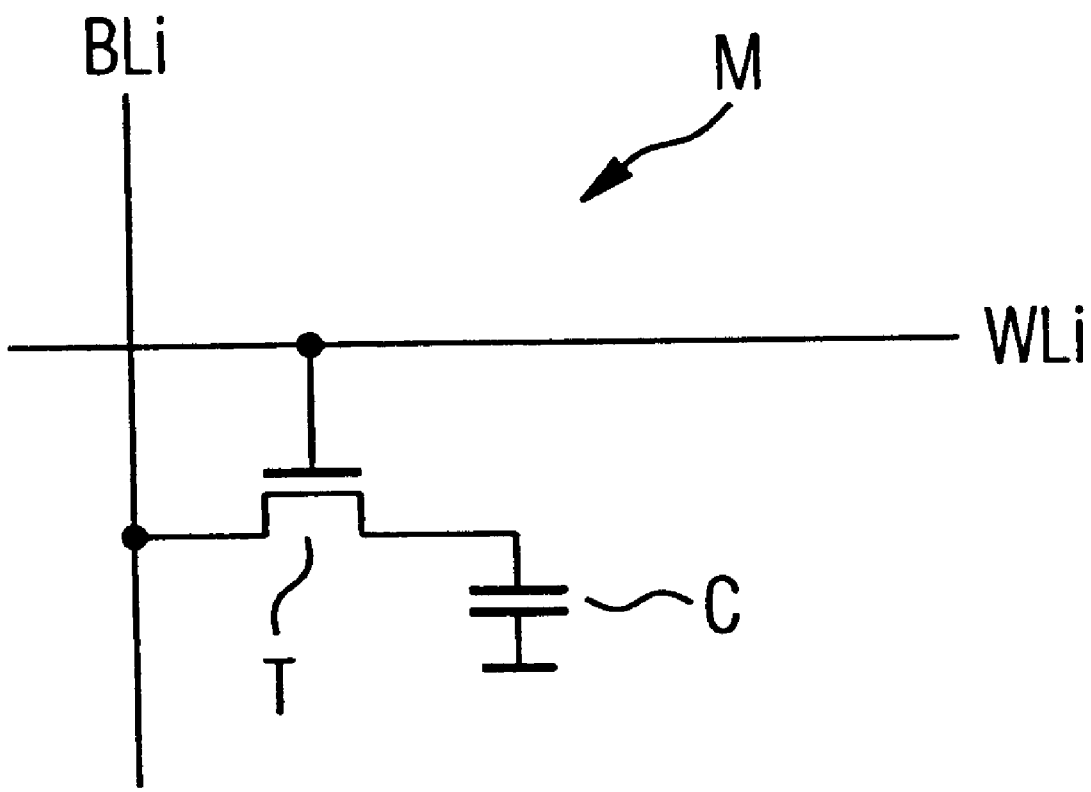
FIG. 5 is a circuit diagram of a 1-transistor/1-capacitor memory cell which is part of the 2-transistor/2-capacitor memory cells of the integrated memory.

FIG. 5 shows a structure of one of the 1-transistor/1-capacitor memory cells M of the exemplary embodiments that are illustrated herein. The memory cell M has a selection transistor T and a storage capacitor C. One electrode of the storage capacitor C is connected to ground and another electrode is connected through the selection transistor T to the associated bit line BLi. A control terminal of the selection transistor T is connected to the associated word line WLi. Memory cells of this type are used, for example, in DRAMs (Dynamic Random Access Memories). In the case of FRAMs, the storage capacitor C has a ferroelectric dielectric and its electrode remote from the selection transistor T is connected to a plate potential to be pulsed. In addition, the invention can also be applied to other memory types.

In the case of the memory of FIG. 1, each two of the 1-transistor/1-capacitor memory cells M which are adjacent on one of the word lines WLi may be combined to form a 2-transistor/2-capacitor memory cell MC. The bit lines connected to each of these two 1-transistor/1-capacitor memory cells M form a bit line pair. Each bit line pair is assigned a sense amplifier SA, to which the respective bit lines BLi, $\overline{BLi}$ are connected through connecting lines. The connecting lines which connect the bit lines BL1 and $\overline{BL0}$ to the associated sense amplifiers SA are therefore crossed-over in this exemplary embodiment.

The 2-transistor/2-capacitor memory cell MC which is illustrated at the very top in FIG. 1, for example, is accessed by activation of the first word line WL0. As a result of this, the two selection transistors T of this 2-transistor/2-capacitor memory cell MC are turned on and the two storage capacitors C are each connected to one of the two bit lines BL0, $\overline{BL0}$ of the associated bit line pair. In the event of a read access, the sense amplifier SA assigned to this bit line pair amplifies a differential signal established on the bit line pair. In the event of a write access, the associated sense amplifier SA generates respectively complementary levels on the two bit lines BL0, $\overline{BL0}$, with the result that a logical one is written to one 1-transistor/1-capacitor memory cell M of the 2-transistor/2-capacitor memory cells MC and a logical zero is written to the other cell. As a result of this, in the event of a read access, when the selection transistors T are turned on, a differential signal is obtained which has a voltage swing that is twice as large as it would be if each datum were stored only in a single 1-transistor/1-capacitor memory cell.

Figure 2:
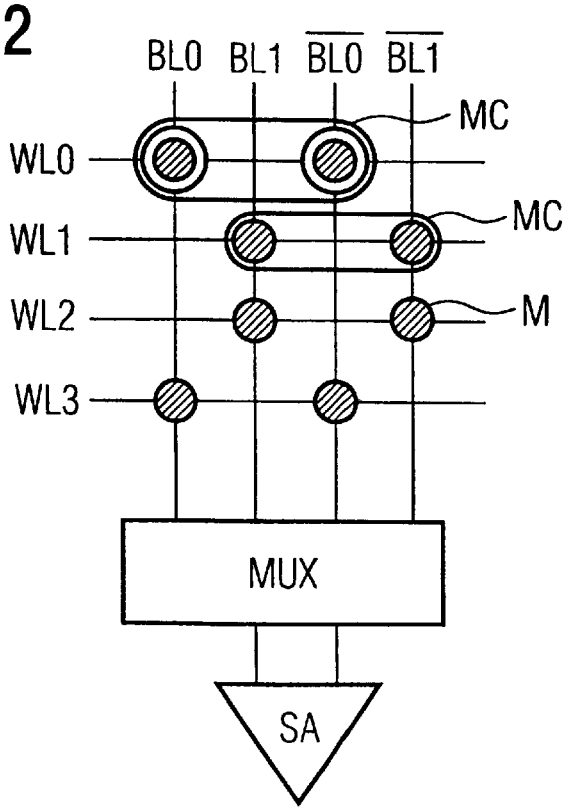
FIG. 2 is a circuit diagram of a memory according to the invention, in which the bit line pairs of the memory are connected to sense amplifiers through multiplexers.

FIG. 2 shows a second exemplary embodiment of the memory according to the invention, having 1-transistor/1-capacitor memory cells M which are parts of the 2-transistor/2-capacitor memory cells MC and are disposed at crossover points between the word lines WLi and bit lines BLi, $\overline{BLi}$ in the same way as in the exemplary embodiment shown in FIG. 1. However, in this exemplary embodiment, the two bit line pairs that are illustrated are connected through a multiplexer MUX to a common sense amplifier SA. If, on one hand, a 2-transistor/2-capacitor memory cell MC which is connected to the first bit line pair BL0, $\overline{BL0}$ is accessed, the multiplexer MUX conductively connects the bit line pair to the sense amplifier SA. If, on the other hand, the second bit line pair BL1, $\overline{BL1}$ is accessed, the multiplexer MUX connects this bit line pair to the sense amplifier SA. The multiplexer is driven in a manner dependent on a word line address.

Figure 3:
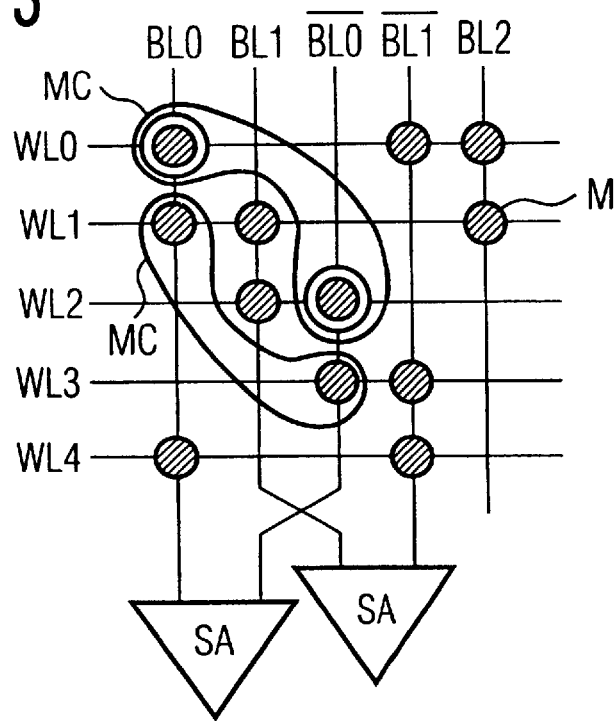
FIG. 3 is a circuit diagram of a memory according to the invention, in which memory cells of the memory are connected to two word lines in each case.

FIG. 3 shows an exemplary embodiment of the memory according to the invention in which the 1-transistor/1-capacitor memory cells M have a different distribution than in the previous exemplary embodiments. In the case of the FIG. 3 embodiment, each of the 2-transistor/2-capacitor memory cells MC is formed by two 1-transistor/1-capacitor memory cells M which are connected to different word lines WLi. FIG. 3 once again identifies merely two of the 2-transistor/2-capacitor memory cells MC, in order not to impair clarity. In order, by way of example, to access the 2-transistor/2-capacitor memory cell MC which is identified at the top left in FIG. 3, the two word lines WL0 and WL2 are activated simultaneously. As a result, the two 1-transistor/1-capacitor memory cells M of this 2-transistor/2-capacitor memory cell MC are connected to the two bit lines BL0, $\overline{BL0}$ of the first bit line pair.

Figure 4:
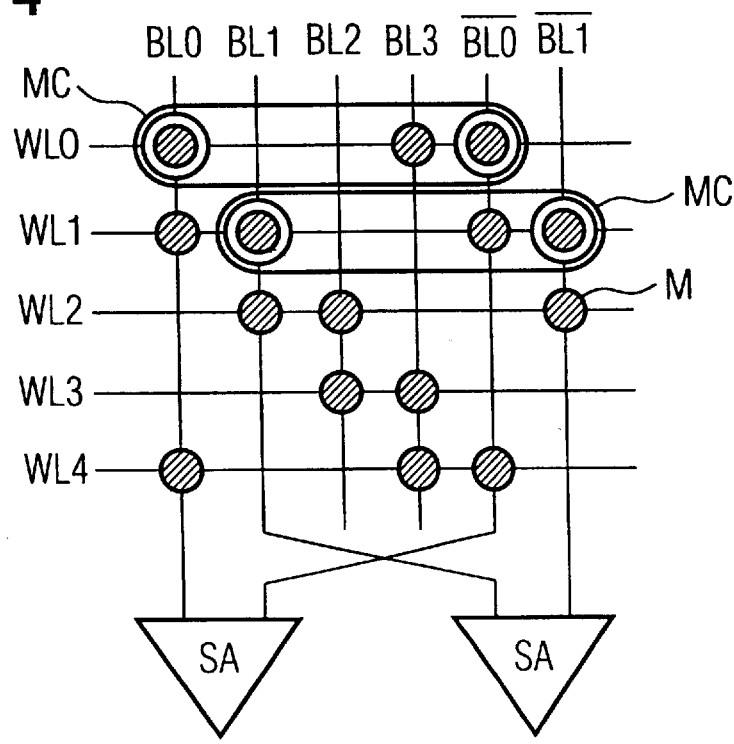
FIG. 4 is a circuit diagram of a memory according to the invention in which each memory cell is connected to only one word line.

FIG. 4 shows a further exemplary embodiment of the invention in which the 1-transistor/1-capacitor memory cells M likewise have the distribution shown in FIG. 3. In this case, however, two of those 1-transistor/1-capacitor memory cells M which are connected to a common word line WLi in each case are combined to form one of the 2-transistor/2-capacitor memory cells MC. Three bit lines of other bit line pairs in each case are located between the two associated bit lines BLi, $\overline{BLi}$ of each bit line pair. This memory is addressed in a manner corresponding to that of the exemplary embodiment illustrated in FIG. 1.

We claim:
1. An integrated memory, comprising:
   word lines and bit lines intersecting each other at crossover points, said bit lines combined into bit line pairs, said bit line pairs interleaved by having at least one of said bit lines of one bit line pair disposed between said two bit lines of another bit line pair;
   2-transistor/2-capacitor memory cells each having two 1-transistor/1-capacitor memory cells each disposed at a respective one of said crossover points;
   each of said two 1-transistor/1-capacitor memory cells of said 2-transistor/2-capacitor memory cells having a selection transistor connected to one of said two bit lines of a respective one of said bit line pairs and connected to at least one of said word lines; and
   said selection transistors to be simultaneously activated for simultaneously accessing said two 1-transistor/1-capacitor memory cells of one of said 2-transistor/2-capacitor memory cell.

2. The integrated memory according to claim 1, wherein said two selection transistors of said two 1-transistor/1-capacitor memory cells of each of said 2-transistor/2-capacitor memory cell have control terminals connected to the same word line.

3. The integrated memory according to claim 1, including sense amplifiers each assigned to a respective one of said bit line pairs and having inputs connected to said bit lines of said bit line pair by crossed-over connecting lines.

4. The integrated memory according to claim 1, including sense amplifiers each assigned to at least two of said bit line pairs and having inputs, and multiplexers each connected between said bit lines of said bit line pairs and said inputs of said sense amplifiers.

* * * * *